United States Patent
Ishiguro et al.

(10) Patent No.: US 12,063,862 B2
(45) Date of Patent: Aug. 13, 2024

(54) PIEZOELECTRIC FIBER COMPOSITE HAVING SEPARATE JOINT PORTIONS AND PIEZOELECTRIC CLOTHING CONTAINING THE SAME

(71) Applicants: Kao Corporation, Tokyo (JP); OKAMOTO CORPORATION, Nara (JP); Murata Manufacturing Co., Ltd., Nagaokakyo (JP)

(72) Inventors: Kenji Ishiguro, Tochigi (JP); Yutaka Murai, Tochigi (JP); Kouichi Hosoya, Tochigi (JP); Osamu Onishi, Nara (JP); Daiji Tamakura, Nagaokakyo (JP); Takafumi Inoue, Nagaokakyo (JP); Masayuki Tsuji, Nagaokakyo (JP); Kenichiro Takumi, Nagaokakyo (JP)

(73) Assignees: KAO CORPORATION, Tokyo (JP); OKAMOTO CORPORATION, Nara (JP); MURATA MANUFACTURING CO., LTD, Nagaokakyo (JP)

(*) Notice: Subject to any disclaimer, the term of this patent is extended or adjusted under 35 U.S.C. 154(b) by 881 days.

(21) Appl. No.: 17/094,357

(22) Filed: Nov. 10, 2020

(65) Prior Publication Data
US 2021/0057633 A1 Feb. 25, 2021

Related U.S. Application Data

(63) Continuation of application No. PCT/JP2019/020849, filed on May 27, 2019.

(30) Foreign Application Priority Data

Jun. 12, 2018 (JP) .................................. 2018-112230

(51) Int. Cl.
*H10N 30/00* (2023.01)
*D03D 1/00* (2006.01)
(Continued)

(52) U.S. Cl.
CPC ....... *H10N 30/1061* (2023.02); *D03D 1/0088* (2013.01); *H02N 2/18* (2013.01);
(Continued)

(58) Field of Classification Search
CPC .. H10N 30/1061; H10N 30/30; D03D 1/0088; B32B 7/025; Y10T 29/42
(Continued)

(56) References Cited

U.S. PATENT DOCUMENTS

| | | | |
|---|---|---|---|
| 10,667,904 B2 * | 6/2020 | Marquez | ............... A61F 2/2418 |
| 2018/0108826 A1 | 4/2018 | Tajitsu et al. | |
| 2019/0003905 A1 | 1/2019 | Yoshida et al. | |

FOREIGN PATENT DOCUMENTS

| | | |
|---|---|---|
| JP | S6292368 A | 4/1987 |
| JP | 2016209149 A | 12/2016 |

(Continued)

OTHER PUBLICATIONS

Microorganism Control—Science and Engineering published by Kodansha Ltd, Copyright T. Tsuchido, H. Kourai, H. Matsuoka, J. Koizumi, 2002; "Electrical Control" Section 4.1.3, p. 50. (Translation of section 4.1.3, p. 50).

(Continued)

*Primary Examiner* — Thiem D Phan
(74) *Attorney, Agent, or Firm* — ArentFox Schiff LLP

(57) ABSTRACT

A piezoelectric fiber composite that includes a substrate having a first expansion and contraction rate, a piezoelectric fiber assembly having piezoelectric fibers that generate electrical charges upon application of external energy and has a second expansion and contraction rate different from the first expansion and contraction rate of the substrate, and a joint portion that joins the substrate and the piezoelectric fiber assembly.

10 Claims, 12 Drawing Sheets

(51) Int. Cl.
*H02N 2/18* (2006.01)
*H10N 30/857* (2023.01)

(52) U.S. Cl.
CPC ....... *H10N 30/857* (2023.02); *D10B 2401/16* (2013.01); *Y10T 29/42* (2015.01)

(58) Field of Classification Search
USPC .................................... 29/25.35, 609.1, 830
See application file for complete search history.

(56) References Cited

FOREIGN PATENT DOCUMENTS

| WO | 2016175321 A1 | 11/2016 |
| WO | 2017111108 A1 | 6/2017 |
| WO | 2018084054 A1 | 5/2018 |

OTHER PUBLICATIONS

Takaki, Koichi; "Agricultural and Food Processing Applications of High-Voltage and Plasma Technologies"; J. HTSJ, vol. 51, No. 216, Jul. 2012, pp. 64-69. (Translation of Section 5 p. 67 "Freshness retention and component extraction by high voltage").
International Search Report issued for PCT/JP2019/020849, date of mailing Jul. 30, 2019.
Written Opinion of the International Searching Authority issued for PCT/JP2019/020849, date of mailing Jul. 30, 2019.

\* cited by examiner

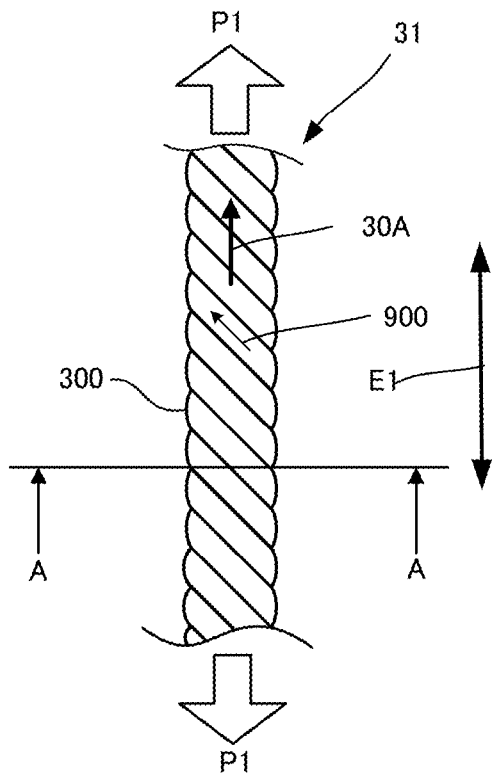
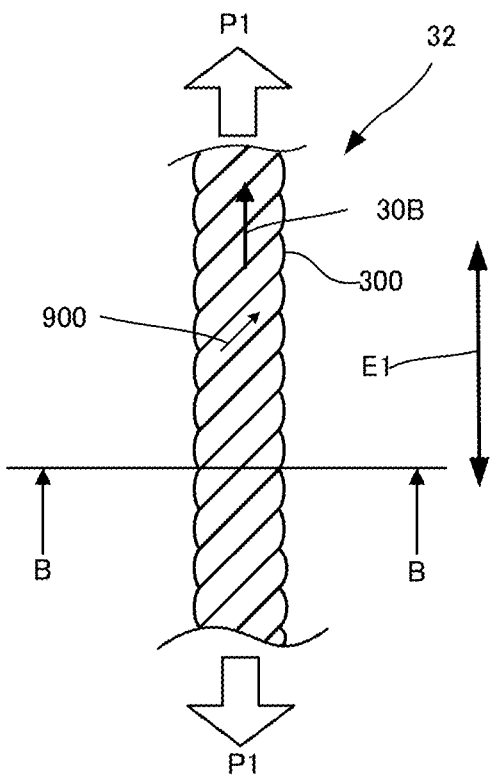
FIG.3A  FIG.3C
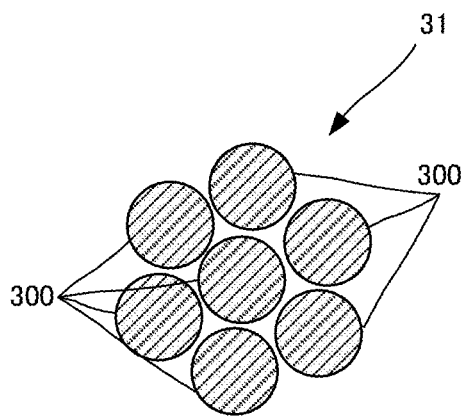
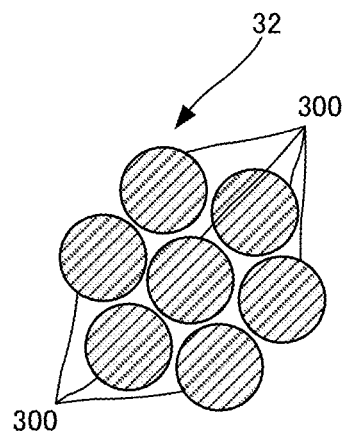
FIG.3B  FIG.3D

PIEZOELECTRIC FIBER COMPOSITE HAVING SEPARATE JOINT PORTIONS AND PIEZOELECTRIC CLOTHING CONTAINING THE SAME

CROSS REFERENCE TO RELATED APPLICATIONS

The present application is a continuation of International application No. PCT/JP2019/020849, filed May 27, 2019, which claims priority to Japanese Patent Application No. 2018-112230, filed Jun. 12, 2018, the entire contents of each of which are incorporated herein by reference.

FIELD OF THE INVENTION

The present invention relates to a piezoelectric fiber composite and piezoelectric clothing that exhibits antibacterial properties.

BACKGROUND OF THE INVENTION

Conventionally, piezoelectric fabric formed of yarn containing a piezoelectric base material has been proposed (see International Publication No. 2017/111108, hereinafter Patent Literature 1). The piezoelectric fabric described in Patent Literature 1 is fabric that exhibits a piezoelectric effect upon application of an external stimulus (for example, physical force). In addition, a cloth that exhibits antibacterial properties upon application of external energy has been proposed (see Japanese Patent No. 6292368, hereinafter Patent Literature 2).

SUMMARY OF THE INVENTION

However, a cloth (piezoelectric fabric) that exhibits antibacterial properties is required to exhibit such antibacterial properties with a small amount of input external energy.

Therefore, an object of embodiments of the present invention is to provide a piezoelectric fiber composite that exhibits antibacterial properties with a small amount of input energy.

A piezoelectric fiber composite according to an embodiment of the present invention includes a substrate having a first expansion and contraction rate, a piezoelectric fiber assembly having piezoelectric fibers that generate an electric charge upon application of external energy and having a second expansion and contraction rate different from the first expansion and contraction rate of the substrate, and a joint portion that joins the substrate and the piezoelectric fiber assembly.

A piezoelectric fiber composite according to another embodiment of the present invention includes a substrate, a piezoelectric fiber assembly having piezoelectric fibers that generate an electric charge upon application of external energy, and a plurality of joint portions that join the substrate and the piezoelectric fiber assembly such that the piezoelectric fiber assembly is stretchable between at least two of the joint portions during use.

Note that "during use" refers to "during wearing", for example, in a case where a piezoelectric fiber composite is used for clothing.

It is known that growth of *bacillus*, fungi, and the like can be suppressed by an electric field (see, for example, Tetsuaki TSUCHIDO, Hironori KORAI, Hideaki MATSUOKA, Junichi KOIZUMI "biseibutu seigyo-kagaku to kougaku (microbial control-science and engineering)" published by Kodansha Ltd. and see, for example, Koichi TAKAGI "Agricultural and Food Processing Applications of High-Voltage and Plasma Technologies", J.HTSJ, Vol. 51, No. 216). Furthermore, a current may flow through a current path formed by moisture or the like or a circuit formed by a micro discharge phenomenon or the like due to an electric potential that causes the electric field. It can be considered that this current weakens the bacteria and suppresses growth of the bacteria. Upon application of external energy, the piezoelectric fiber composite according to an embodiment of the present invention generates an electric field between at least two piezoelectric fibers that have different potentials when electrical charges are generated or generates an electric field between the piezoelectric fibers and an object (e.g., a human body) that has a predetermined potential (including a ground potential) when the piezoelectric fiber composite is brought close to this object. Alternatively, upon application of external energy, the piezoelectric fiber composite according to an embodiment of the present invention passes a current, for example, through moisture, between at least two piezoelectric fibers that have different potentials when electrical charges are generated, or passes a current, for example, through moisture such as sweat, between the piezoelectric fibers and an object (e.g., a human body) that has a predetermined potential (including a ground potential) when the piezoelectric fiber composite is brought close to this object.

Therefore, the piezoelectric fiber composite according to an embodiment of the present invention exhibits antibacterial properties for the following reasons. The piezoelectric fiber composite produces an effect of killing bacteria or weakening bacteria since a cell membrane of bacteria or an electron transport system essential to life of bacteria is impaired by a direct effect of an electric field or a current generated when the piezoelectric fiber composite is incorporated into objects (e.g., clothing, medical goods such as masks, or filters used for electric products) used in close proximity to an another object (e.g., a human body) having a predetermined potential. Furthermore, in the piezoelectric fiber composite, oxygen contained in water may change to a reactive oxygen species by the electric field or the current. Alternatively, in the piezoelectric fiber composite, oxygen radicals may be generated in cells of bacteria due to a stressful environment resulting from the presence of the electric field or the current. In the piezoelectric fiber composite, bacteria are killed or weakened by the reactive oxygen species including these radicals. In the piezoelectric fiber composite, an antibacterial effect may be exhibited because of a combination of the above reasons. The "antibacterial" as used herein is a concept encompassing both an effect of weakening bacteria and an effect of killing bacteria.

In the piezoelectric fiber composite according to an embodiment of the present invention, the piezoelectric fiber assembly is joined to the substrate in a state of being stretched to a natural length or a length longer than the natural length of the piezoelectric fiber assembly. For this reason, even in a case where a small load is applied to the piezoelectric fiber composite, the load is efficiently transmitted to the piezoelectric fiber assembly, and therefore antibacterial properties can be exhibited with a small amount of input energy.

According to embodiments of the present invention, it is possible to provide a piezoelectric fiber composite that exhibits antibacterial properties with a small amount of input energy.

BRIEF DESCRIPTION OF THE DRAWINGS

FIG. 3A is a partial exploded view illustrating an example of a configuration of the piezoelectric fiber, FIG. 3B is a cross-sectional view taken along line A-A of FIG. 3A, FIG. 3C is a partial exploded view illustrating another example of a configuration of the piezoelectric fiber, and FIG. 3D is a cross-sectional view taken along line B-B of FIG. 3C.

DETAILED DESCRIPTION OF THE PREFERRED EMBODIMENTS

Figure 1:
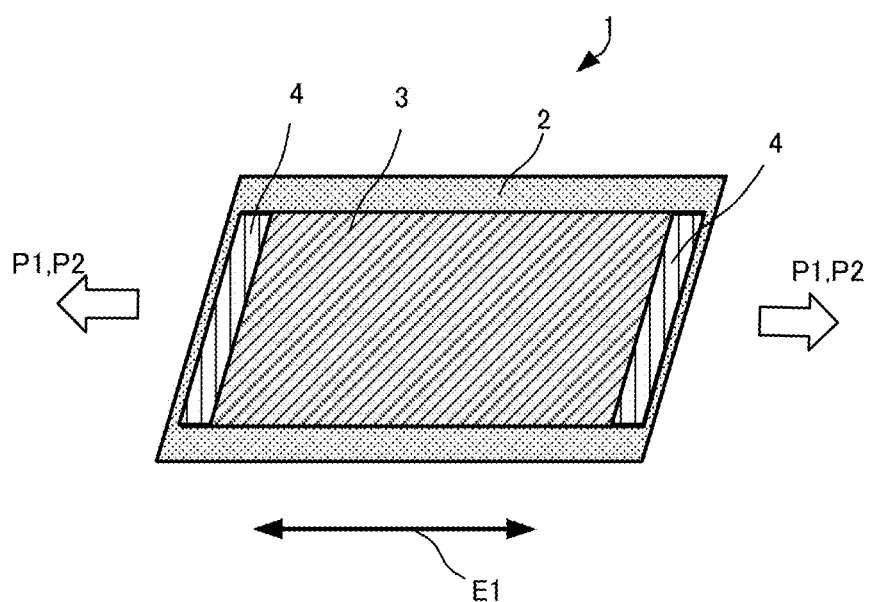
FIG. 1 is a configuration diagram illustrating an example of a configuration of a piezoelectric fiber composite.

A piezoelectric fiber composite 1 according to an embodiment will be described with reference to the drawings. FIG. is a configuration diagram illustrating an example of the piezoelectric fiber composite 1. As illustrated in FIG. 1, the piezoelectric fiber composite 1 includes a substrate 2, a piezoelectric fiber assembly 3, and a plurality of (two in FIG. 1) joint portions 4. The piezoelectric fiber composite 1 has, for example, a two-layer structure in which the piezoelectric fiber assembly 3 is arranged on a main surface (one surface) of the substrate 2.

The substrate 2 is, for example, a cloth (for example, a knit, a woven fabric, or a nonwoven fabric) made of fibers (filaments). An expansion and contraction rate of the substrate 2 is lower than that of the piezoelectric fiber assembly 3. In other words, the substrate 2 is harder to stretch (deform) than the piezoelectric fiber assembly 3 upon application of external energy (for example, tension P1). Since the substrate 2 is harder to expand and contract, the piezoelectric fiber composite 1 can reduce damage such as breakage caused by application of external energy. Since the substrate 2 is configured as described above, the piezoelectric fiber composite 1 can be applied to thin items such as clothing and cover sheets.

The substrate 2 may be formed of fibers (filaments) made of a material having a low expansion and contraction rate. In addition, the substrate 2 may have a structure (e.g., a non-woven fabric) that makes an expansion and contraction rate low. Further, the substrate 2 may be formed of a monofilament or a multifilament. Further, the substrate 2 is not limited to the example of the cloth made of fibers, and may be paper or a resin or a metal formed in a sheet shape. Further, the substrate 2 is not limited to a sheet shape such as a cloth, and may have a shape, such as a thick plate shape, other than a sheet shape. The substrate 2 may have, for example, a strip shape or a frame shape.

The plurality of joint portions 4 join the substrate 2 and the piezoelectric fiber assembly 3 together. The plurality of joint portions 4 join (fix) the piezoelectric fiber assembly 3 to the substrate 2, for example, by stitching. For example, the plurality of joint portions 4 join the piezoelectric fiber assembly 3 to the substrate 2 at opposed ends in one direction (i.e., a stretching direction) E1 of the piezoelectric fiber assembly 3. It is preferable that joint portions 4 are arranged to face each other in the stretching direction E1 of the piezoelectric fiber assembly 3.

Figure 2A:
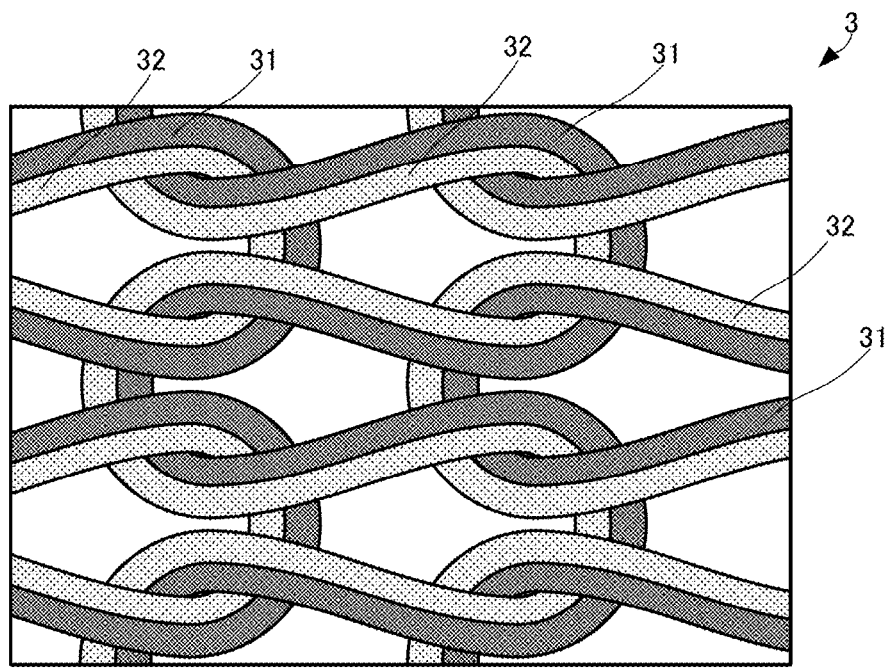
FIG. 2A is a schematic diagram illustrating an example of a piezoelectric fiber assembly (a state in which piezoelectric fibers are not stretched)
Figure 2B:
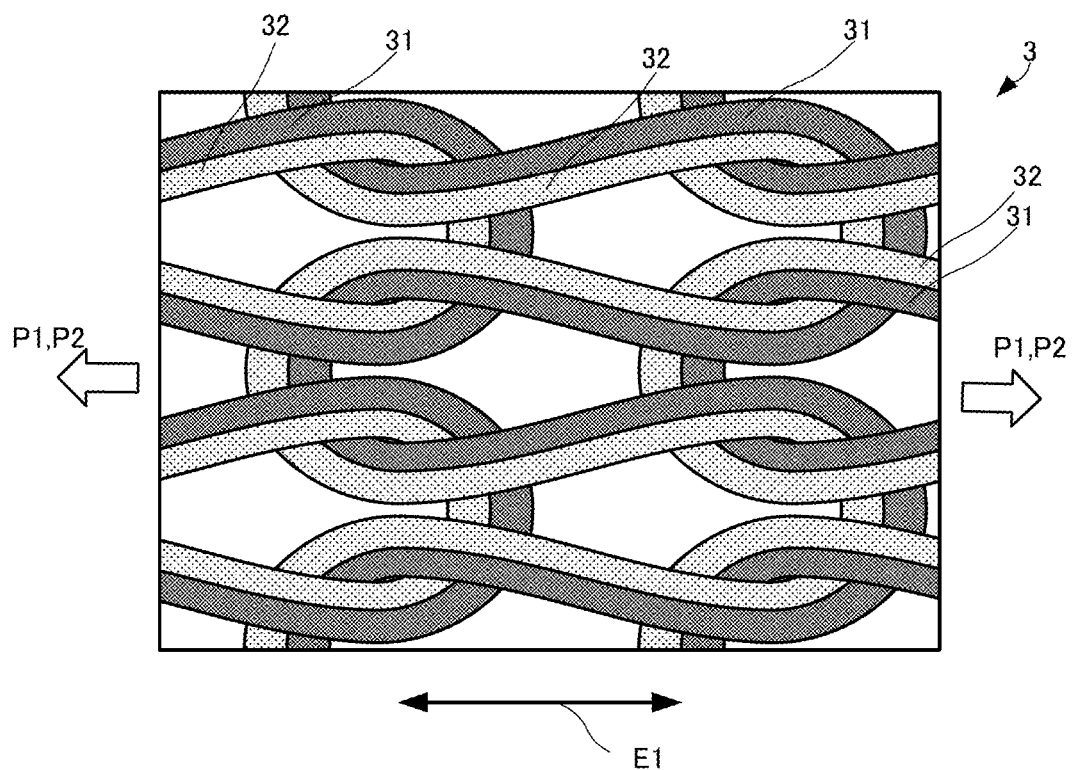
FIG. 2B is a schematic diagram illustrating another example of the piezoelectric fiber assembly (a state in which the piezoelectric fibers are stretched).

FIG. 2A is a schematic diagram illustrating an example of the piezoelectric fiber assembly 3 according to the present embodiment (in a state in which piezoelectric fiber 31 and piezoelectric fiber 32 are not stretched). FIG. 2B is a schematic diagram illustrating another example of the piezoelectric fiber assembly 3 (in a state in which the piezoelectric fiber 31 and the piezoelectric fiber 32 are stretched). FIG. 3A is a partial exploded view illustrating an example of a configuration of the piezoelectric fiber 31 that constitutes the piezoelectric fiber assembly 3. FIG. 3B is a cross-sectional view taken along line A-A of FIG. 3A. FIG. 3C is a partial exploded view illustrating an example of a configuration of the piezoelectric fiber 32. FIG. 3D is a cross-sectional view taken along line B-B of FIG. 3C.

As illustrated in FIG. 1, the piezoelectric fiber assembly 3 is stretchable and expands and contracts (stretches) between the joint portions 4 facing each other in the stretching direction E1. The piezoelectric fiber assembly 3 includes the piezoelectric fiber 31 and the piezoelectric fiber 32, as illustrated in FIGS. 2A and 2B. The piezoelectric fiber assembly 3 has a knit construction knitted from the piezoelectric fiber and the piezoelectric fiber 32. The piezoelectric fiber assembly 3 expands and contracts due to input of external energy. For example, when the tension P1 is applied, the piezoelectric fiber assembly 3 stretches from the state illustrated in FIG. 2A to the state illustrated in FIG. 2B. The piezoelectric fiber assembly 3 is thus configured to easily stretch in the stretching direction E1 upon application of the tension P1.

The piezoelectric fiber 31 and the piezoelectric fiber 32 will be described in detail below. The piezoelectric fiber 31 and the piezoelectric fiber 32 are each a thread (multifilament thread) formed by twisting a plurality of (e.g., seven in FIG. 3A, FIG. 3B, FIG. 3C, and FIG. 3D) filaments 300 having piezoelectricity, as illustrated in FIG. 3A, FIG. 3B, FIG. 3C, and FIG. 3D. As illustrated in FIG. 3A, the piezoelectric fiber is a right-handed thread (hereinafter referred to as a S thread) formed by twisting the filaments 300 rightward. As illustrated in FIG. 3C, the piezoelectric fiber 32 is a left-handed thread (hereinafter referred to as a Z thread) formed by twisting the filaments 300 leftward.

The piezoelectric fiber 31 and the piezoelectric fiber 32 are each, for example, a piezoelectric fiber assembly formed by twisting seven filaments 300, but the number of filaments 300 is not limited to this and is actually set as appropriate, for example, in view of usage.

The filaments 300 are fibers preferably having a circular cross section, as illustrated in FIGS. 3B and 3D. The filaments 300 are electrical charge generation fibers (electrical charge generation threads) that generate an electrical charge upon application of external energy. For example, when the tension P1 is applied to the piezoelectric fiber 31 or the piezoelectric fiber 32, the filaments 300 generate electrical charges. The filaments 300 are made of a functional polymer (for example, piezoelectric polymer). Examples of the piezoelectric polymer include polylactic acid (PLA). Polylactic acid (PLA) is a piezoelectric polymer that does not have pyroelectricity. Polylactic acid exhibits piezoelectricity by being uniaxially stretched. Examples of polylactic acid include PLLA in which an L-isomer monomer is polymerized and PDLA in which a D-isomer monomer is polymerized. The filaments 300 may further include a material other than the functional polymer as long as it does not hinder the function of the functional polymer. Further, the filaments 300 are not limited to one having a circular cross section.

Note that polylactic acid is a chiral polymer, and its main chain has a helical structure. Polylactic acid has piezoelectricity when it is uniaxially stretched and its molecules are oriented. Further, when polylactic acid is further thermally treated to increase crystallinity, a piezoelectric constant increases. Since polylactic acid has piezoelectricity due to the orientation of molecules as a result of stretching, unlike other piezoelectric polymers such as PVDF (polyvinylidene fluoride) or piezoelectric ceramics, it is not necessary to perform poling treatment. The piezoelectric constant of uniaxially stretched polylactic acid is about 5 pC/N to 30 pC/N, which is very high among polymers. Furthermore, the piezoelectric constant of polylactic acid does not fluctuate over time and is extremely stable.

Figure 4A:
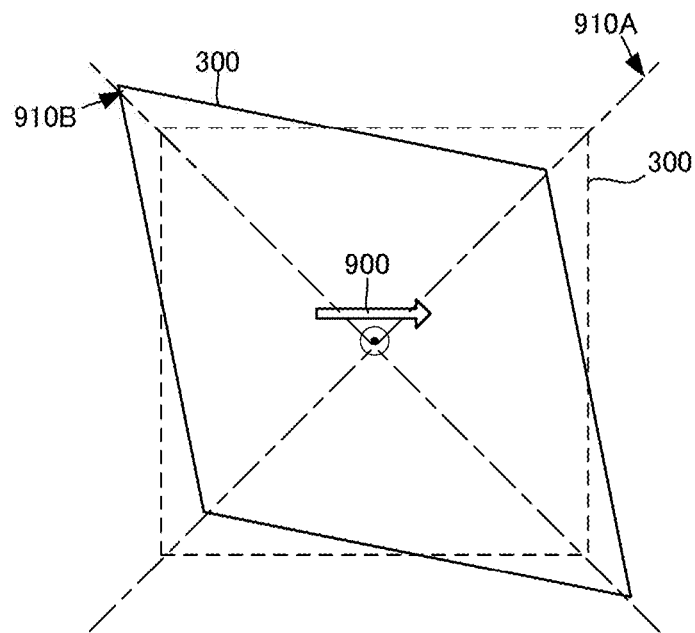
FIG. 4A is a diagram illustrating an example of a relationship among a uniaxial stretching direction of polylactic acid, an electric field direction, and deformation of the piezoelectric fiber.
Figure 4B:
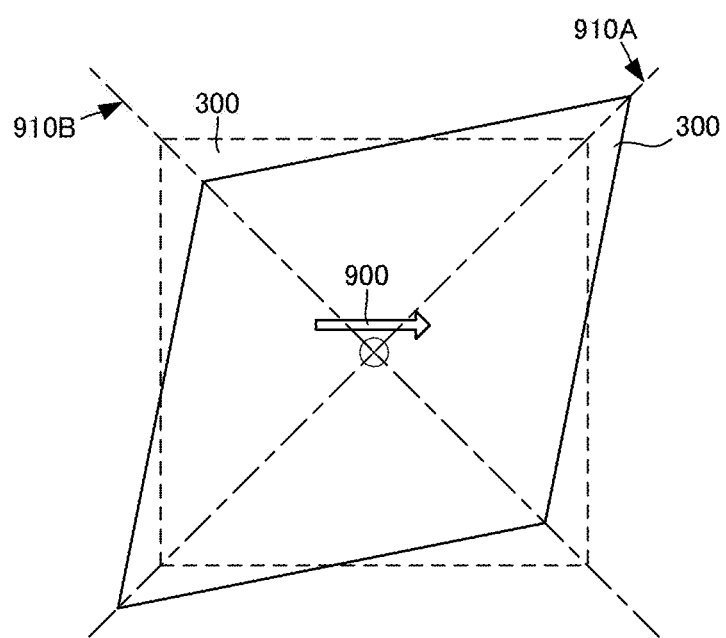
FIG. 4B is a diagram illustrating another example of a relationship among the uniaxial direction of polylactic acid, the electric field direction, and deformation of the piezoelectric fiber.

FIG. 4A is a diagram illustrating an example of a relationship among a uniaxial stretching direction 900 of L-isomer polylactic acid (PLLA), an electric field direction, and deformation of the filament 300. FIG. 4B is a diagram illustrating another example of the relationship among the uniaxial stretching direction 900 of the L-isomer polylactic acid, the electric field direction, and the deformation of the filament 300. FIG. 4A and FIG. 4B are diagrams illustrating a model case in which the filament 300 has a film shape.

The filament 300 made of uniaxially stretched polylactic acid has tensor components $d_{14}$ and $d_{25}$ as piezoelectric strain constants when a thickness direction is defined as a first axis, the uniaxial stretching direction 900 is defined as a third axis, and a direction orthogonal to both the first axis and the third axis is defined as a second axis. Therefore, the filament 300 made of uniaxially stretched polylactic acid most efficiently generates electrical charges when strain occurs in a direction of 45 degrees with respect to the uniaxial stretching direction 900.

The filament 300 is preferably PLLA and generates an electric field in a direction from a rear side toward a front side of paper when contracting in a direction indicated by a first diagonal line 910A and expanding in a direction indicated by a second diagonal line 910B orthogonal to the first diagonal line 910A as illustrated in FIG. 4A. That is, the filament 300 generates negative charges on the front side of the paper. The filament 300 also generates electrical charges when expanding in the direction indicated by the first diagonal line 910A and contracting in the direction indicated by the second diagonal line 910B but in reverse polarities, that is, generates an electric field in a direction from the front surface toward the rear surface of the paper, as illustrated in FIG. 4B. That is, the filament 300 generates positive charges on the front side of the paper.

The uniaxial stretching direction 900 of the filament 300 coincides with or is parallel to an axial direction of the filament 300. As illustrated in FIG. 3A, the uniaxial stretching direction 900 of the filament 300 in the piezoelectric fiber 31 is inclined to the left with respect to an axial direction 30A of the piezoelectric fiber 31 on the paper on which FIG. 3A is drawn. Meanwhile, as illustrated in FIG. 3C, the uniaxial stretching direction 900 of the filament 300 in the piezoelectric fiber 32 is inclined to the right with respect to an axial direction 30B of the piezoelectric fiber 32 on the paper.

The inclinations of the uniaxial stretching direction 900 of the filament 300 with respect to the axial direction 30A of the piezoelectric fiber 31 and the axial direction 30B of the piezoelectric fiber 32 depend on the number of twists of the piezoelectric fiber 31 and the piezoelectric fiber 32. That is, the inclinations of the uniaxial stretching direction 900 with respect to the axial directions of the piezoelectric fiber 31 and piezoelectric fiber 32 are not limited to the angles illustrated in FIGS. 3A and 3C. It is only necessary that the inclination of the uniaxial stretching direction 900 with respect to the axial direction 30A of the piezoelectric fiber 31 intersect the axial direction 30A of the piezoelectric fiber 31. Furthermore, it is only necessary that the inclination of the uniaxial stretching direction 900 with respect to the axial direction 30B of the piezoelectric fiber 32 intersect the axial direction 30B of the piezoelectric fiber 32.

Figures 5A, 5B:
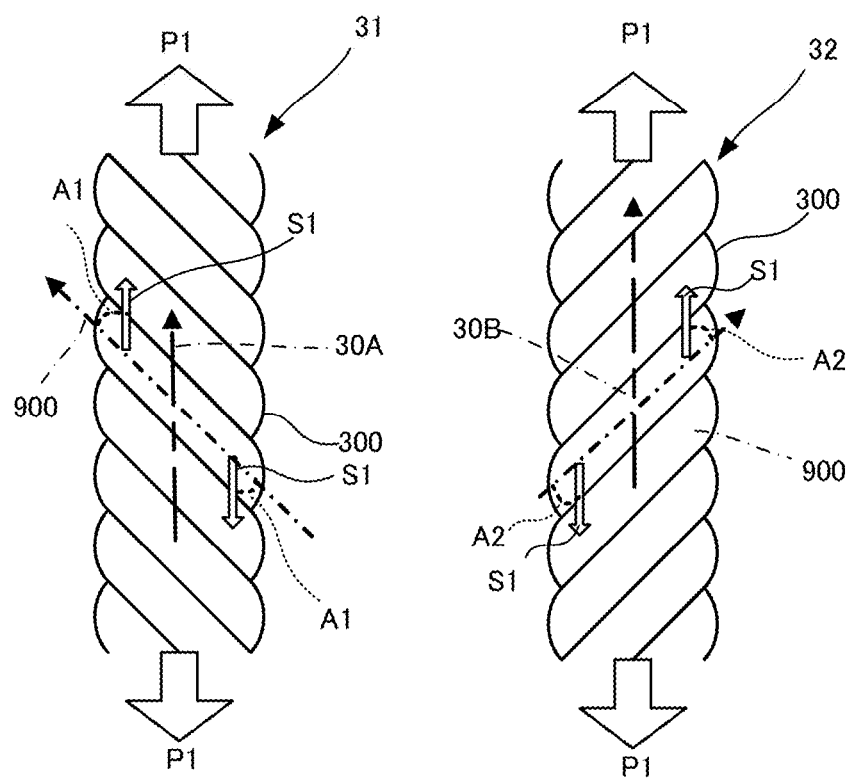
FIG. 5A is a diagram illustrating an example of shear stress (shearing stress) generated in each filament when a tension is applied to the piezoelectric fiber.
FIG. 5B is a diagram illustrating another example of shear stress (shearing stress) generated in each filament when a tension is applied to the piezoelectric fiber.

FIG. 5A is a diagram illustrating a shear stress (shearing stress) S1 generated in each filament 300 when the tension P1 is applied to the piezoelectric fiber 31. FIG. 5B is a diagram illustrating a shear stress (shearing stress) S1 generated in each filament 300 when the tension P1 is applied to the piezoelectric fiber 32. The tension P1 illustrated in FIG. 5A is force that pulls the piezoelectric fiber 31 in the axial direction 30A of the piezoelectric fiber 31 and in a direction opposite to the axial direction 30A. Similarly, the tension P1 illustrated in FIG. 5B is force that pulls the piezoelectric fiber 32 in the axial direction 30B of the piezoelectric fiber 32 and in a direction opposite to the axial direction 30B. An angle A1 is an angle of strain generated with respect to the uniaxial stretching direction 900 of each filament 300 when the tension P1 is applied to the piezoelectric fiber 31. An angle A2 is an angle of strain generated with respect to the uniaxial stretching direction 900 of each filament 300 when the tension P1 is applied to the piezoelectric fiber 32.

As illustrated in FIG. 5A, when the tension P1 is applied to the piezoelectric fiber 31 of the S thread and strain is generated in the direction of the angle A1 with respect to the uniaxial stretching direction 900 of the filament 300, negative charges are generated on a surface of the piezoelectric fiber 31 and positive charges are generated on an inner side of the piezoelectric fiber 31. More specifically, when the tension P1 is applied to the piezoelectric fiber 31, the shear stress S1 acts on the filament 300. As a result, the filament 300 contracts in a direction corresponding to the first diagonal line 910A and expands in a direction corresponding to the second diagonal line 910B (see FIG. 4A). Accordingly, negative charges are generated on the surface of the piezoelectric fiber 31, and positive charges are generated on the inner side of the piezoelectric fiber 31.

As illustrated in FIG. 5B, when the tension P1 is applied to the piezoelectric fiber 32 of the Z thread and the strain is generated in the direction of the angle A2 with respect to the uniaxial stretching direction 900 of the filament 300, positive charges are generated on a surface of the piezoelectric fiber 32 and negative charges are generated on an inner side of the piezoelectric fiber 32. More specifically, when the tension P1 is applied to the piezoelectric fiber 32, the shear stress S1 acts on the filament 300. As a result, the filament 300 expands in a direction corresponding to the first diagonal line 910A and contracts in a direction corresponding to the direction of the second diagonal line 910B (see FIG. 4B). Accordingly, positive charges are generated on the surface of the piezoelectric fiber 32, and negative charges are generated on the inner side of the piezoelectric fiber 32.

The direction corresponding to the second diagonal line 910B is a direction parallel to the direction in which the tension P1 is applied. The shear stress S1 is force that acts in a direction parallel to the tension P1.

Accordingly, when the tension P1 is applied to the piezoelectric fiber assembly 3, each filament 300 generates electrical charges due to the shear stress, and an electric field is generated in the piezoelectric fiber 31 and the piezoelectric fiber 32.

Figure 6:
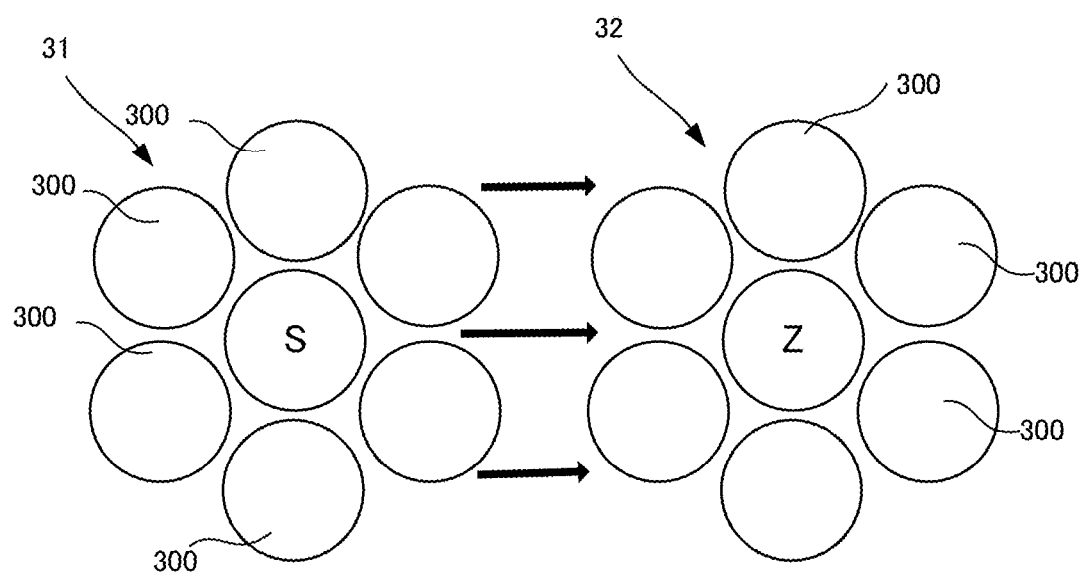
FIG. 6 is a diagram illustrating an example of an electric field in the piezoelectric fiber assembly.

FIG. 6 is a diagram illustrating an example of an electric field in the piezoelectric fiber 31 and the piezoelectric fiber 32. The arrows illustrated in FIG. 6 indicate a direction of the electric field.

When the tension P1 is applied, the piezoelectric fiber assembly 3 can generate a larger electric field between the piezoelectric fiber 31 and the piezoelectric fiber 32 in a case where the piezoelectric fiber 31 which is the S thread and the piezoelectric fiber 32 which is the Z thread are brought close to each other as illustrated in FIG. 6. In a case where the piezoelectric fiber 31 and the piezoelectric fiber 32 are brought close to each other, the electric fields leak into the air and are synthesized. Since the piezoelectric fiber assembly 3 has a knit construction knitted from the piezoelectric fiber and the piezoelectric fiber 32 having the piezoelectric filaments 300, a larger electric field can be generated between the piezoelectric fiber 31 and the piezoelectric fiber 32 than in a case where the piezoelectric fiber 31 or the piezoelectric fiber 32 is used alone.

As described above, it is known that growth of *bacillus* and fungi can be suppressed by an electric field. Furthermore, a current may flow through a current path formed by moisture or the like or a circuit formed by a micro discharge phenomenon or the like due to an electric potential that causes the electric field. It can be considered that this current weakens the bacteria and suppresses growth of the bacteria. The "bacteria" as used herein encompasses *bacillus*, fungi, archaea, or microorganisms such as mites and fleas.

As described above, when the piezoelectric fiber 31 and the piezoelectric fiber 32 are stretched by external energy (the tension P1), an electric field is generated in the piezoelectric fiber assembly 3. That is, the piezoelectric fiber assembly 3 having the piezoelectric fiber 31 and the piezoelectric fiber 32 exhibits antibacterial properties by expanding and contracting due to external energy.

In order for the piezoelectric fiber assembly 3 to exhibit antibacterial properties with a small amount of external energy, it is necessary to efficiently transmit the external energy to the filaments 300. For this purpose, the piezoelectric fiber assembly 3 is fixed to the substrate 2 by at least two joint portions 4. This allows the piezoelectric fiber assembly 3 to maintain a state of being stretched in the stretching direction E1 by the tension P2, as illustrated in FIG. 2B. The piezoelectric fiber 31 and the piezoelectric fiber 32 expand and contract with a small amount of external energy while the piezoelectric fiber assembly 3 maintains the state of being stretched by the tension P2 (hereinafter simply referred to as a stretched state).

For example, it is assumed that the piezoelectric fiber assembly 3 is in a state of being stretched by a tension P2 of 0.5 N or more. That is, it is assumed that the piezoelectric fiber assembly 3 to which desired external energy (for example, a load (tension) P2) is being applied is joined to the substrate 2, as illustrated in FIG. 1. Since the piezoelectric fiber assembly 3, which is being stretched by the tension P2, is further stretched by the tension P1, the piezoelectric fiber 31 and the piezoelectric fiber 32 are further stretched in the stretching direction E1. For example, when external energy (for example, the tension P1) is further applied in a state where the piezoelectric fiber 31 and the piezoelectric fiber 32 are being stretched by the tension P2 of 0.5 N or more, the tension P1 directly transmits to the piezoelectric fiber 31 and the piezoelectric fiber 32. The piezoelectric fiber assembly 3 may be joined to the substrate 2 so that the piezoelectric fiber assembly 3 stretches when the tension P2 is applied during wearing.

In the state where the piezoelectric fiber 31 and the piezoelectric fiber 32 are stretched by the tension P2, the piezoelectric fiber 31 and the piezoelectric fiber 32 expand and contract with a smaller amount of external energy than in a state where the piezoelectric fiber 31 and the piezoelectric fiber 32 are not stretched by the tension P2. As a result, in the piezoelectric fiber composite 1, the piezoelectric fiber 31 and the piezoelectric fiber 32 expand and contract with a small amount of external energy in a state where the piezoelectric fiber assembly 3 is being stretched. The piezoelectric fiber 31 and the piezoelectric fiber 32 generate electrical charges by being stretched with a small amount of external energy in the state where the piezoelectric fiber assembly 3 is being stretched, and the piezoelectric fiber composite 1 exhibits antibacterial properties due to an electric field caused by the electrical charges thus generated.

For example, in a case where the piezoelectric fiber composite 1 is applied to clothing (piezoelectric clothing) and a wearer wears this piezoelectric clothing, the piezoelectric fiber assembly 3 is in a state of being stretched by the tension P2 of 0.5 N or more. The piezoelectric clothing to which the piezoelectric fiber composite 1 is applied exhibits antibacterial properties upon application of energy such as minute movements of the wearer. Furthermore, for example, when the piezoelectric fiber composite 1 is applied to a mask and a wearer wears the piezoelectric mask, the piezoelectric fiber assembly 3 is in a state of being stretched by the tension P2 of 0.5 N or more. The piezoelectric mask expands and contracts with a small amount of energy, for example, by a wearer's breathing, and generates electrical charges by being stretched with a small amount of energy and thereby exhibits antibacterial properties due to an electric field caused by the electrical charges thus generated.

Figure 7:
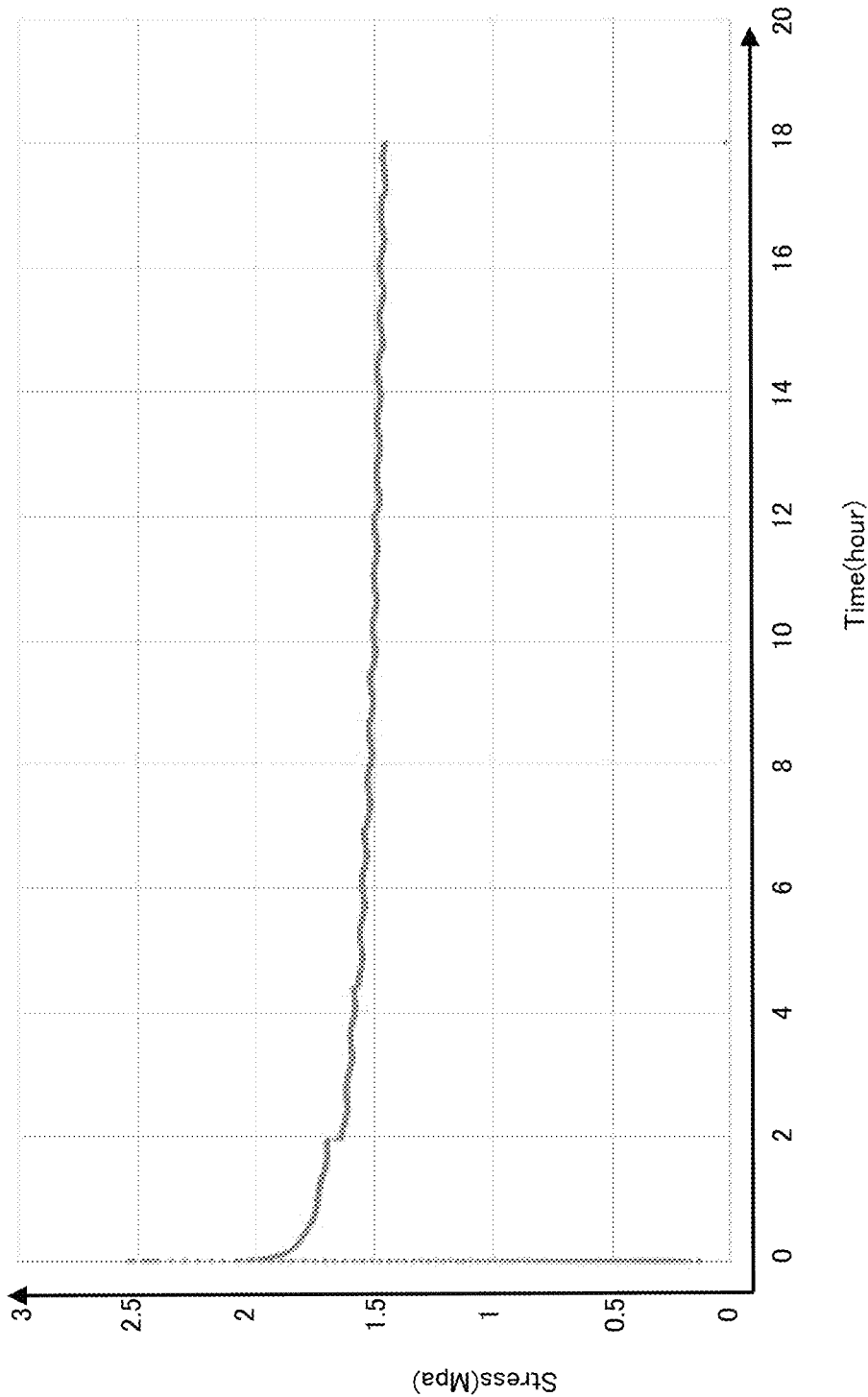
FIG. 7 is an explanatory view illustrating an example of how stress changes over time in a state where a load is applied to the piezoelectric fiber assembly.

FIG. 7 is an explanatory diagram illustrating an example of how stress changes over time in a case where the piezoelectric fiber assembly 3 to which a predetermined load is being applied is fixed at opposed ends in a stretching direction for 18 hours. The vertical axis of the graph in FIG. 7 is stress (MPa), and the horizontal axis is an elapsed time (hour). Upon application of a load, the piezoelectric fiber assembly 3 generates stress against the load, as illustrated in FIG. 7. The stress generated in the piezoelectric fiber assembly 3 gradually decreases with passage of time. The stress applied to the piezoelectric fiber assembly 3 slightly increases and decreases while overall gradually decreasing. That is, in the state where the piezoelectric fiber assembly 3 is being stretched, the piezoelectric fiber 31 and the piezoelectric fiber 32 repeat minute expansion and contraction as indicated by the change in the stress. Since the piezoelectric fiber 31 and the piezoelectric fiber 32 expand and contract in the state where the piezoelectric fiber assembly 3 is being stretched, the piezoelectric fiber assembly 3 exhibits antibacterial properties due to an electric field thus generated. The "antibacterial" as used herein is a concept encompassing both an effect of weakening bacteria and an effect of killing bacteria.

For example, the piezoelectric fiber assembly 3 in the stretched state generates an electric field due to a small deformation of the piezoelectric fiber assembly 3 caused by minute movement of the wearer. Furthermore, the piezoelectric fiber assembly 3 in the stretched state generates an electric field upon application of small external energy in the environment during use, for example, by vibration. As described above, the piezoelectric fiber composite 1 exhibits antibacterial properties with small energy being applied while in the stretched state.

The piezoelectric fiber assembly 3 may be fixed to the substrate 2 by the joint portions 4 so that the piezoelectric fiber assembly 3 does not stretch when a user (wearer) is not using (not wearing) it and stretches when the user (wearer) is using (wearing) it. As a result, the piezoelectric fiber composite 1 stretches depending on a state or a form of use of the wearer and thus gives the wearer a feeling of fit.

Further, the piezoelectric fiber assembly 3 in a stretched state may be fixed to the substrate 2 by the joint portions 4. That is, the piezoelectric fiber assembly 3 that has been stretched to a length longer than a natural length may be fixed to the substrate 2 by the joint portions 4. Therefore, a user can use piezoelectric clothing, a piezoelectric sheet, a piezoelectric filter, or the like to which the piezoelectric fiber composite 1 is applied without worrying about external energy (e.g., tension) during use. The natural length of the piezoelectric fiber assembly 3 is a length of the piezoelectric fiber assembly 3 under application of no load.

Furthermore, the piezoelectric fiber 31 and the piezoelectric fiber 32 may directly exhibit an antibacterial effect since a current is passed through an object (e.g., a human body) having a predetermined potential via moisture such as sweat when the piezoelectric fiber 31 and the piezoelectric fiber 32 are brought close to such an object. Furthermore, the piezoelectric fiber 31 and the piezoelectric fiber 32 may indirectly exhibit an antibacterial effect by radical species, which are oxygen in water changed by an effect of a current or a voltage, radical species produced by interaction or catalytic action with an additive contained in a fiber, and other antibacterial chemical species (such as amine derivatives). Examples of the radical species include superoxide anion radical (reactive oxygen species) and hydroxy radical.

Further, the piezoelectric fiber 31 and the piezoelectric fiber 32 generate an electric field due to a potential difference generated by the electrical charges generated by the piezoelectric fiber 31 and the piezoelectric fiber 32. This electric field also leaks into a nearby space and forms a coupled electric field with other parts. Furthermore, when the piezoelectric fiber 31 and the piezoelectric fiber 32 are brought close to a predetermined potential, for example, an object (e.g., a human body) having a predetermined potential (including a ground potential), the electric potentials generated in the piezoelectric fiber 31 and the piezoelectric fiber 32 generate an electric field among the piezoelectric fiber 31, the piezoelectric fiber 32 and the object.

An application example of the present embodiment will be described below.

Figure 8:
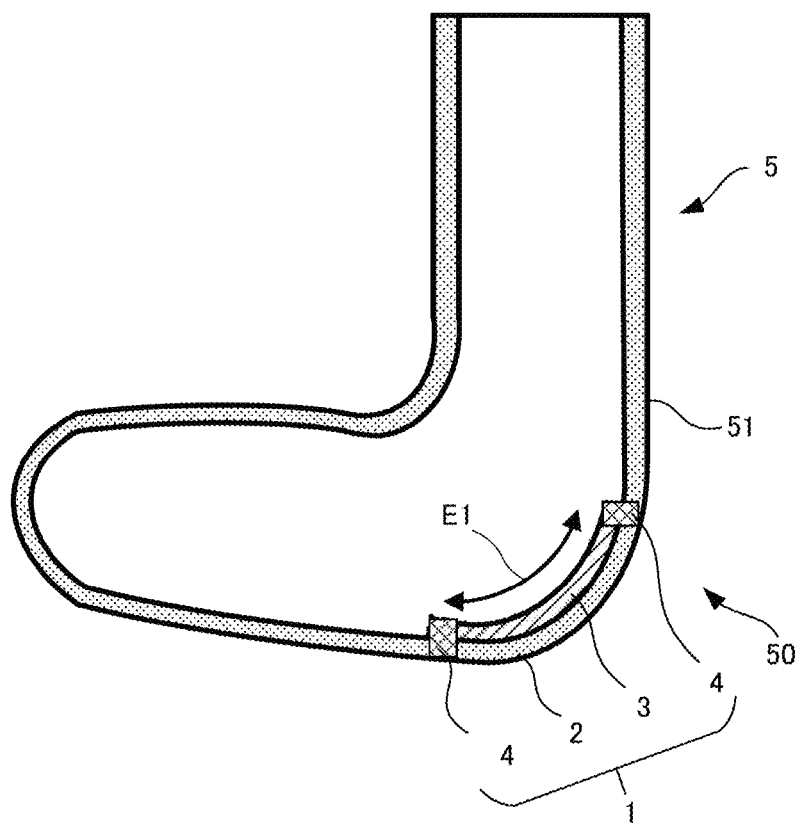
FIG. 8 is a schematic diagram illustrating a sock to which the piezoelectric fiber composite has been applied.

The following describes a case where the piezoelectric fiber composite 1 is applied to a sock 5. FIG. 8 is a schematic view illustrating the sock 5 to which the piezoelectric fiber composite 1 has been applied. As illustrated in FIG. 8, the sock is piezoelectric clothing in which the piezoelectric fiber composite 1 has been applied to a heel portion 50. The heel portion 50 of the sock 5 is formed so that the piezoelectric fiber assembly 3 faces a wearer's body and the substrate 2 faces an outside. That is, the piezoelectric fiber composite 1 applied to the heel portion 50 of the sock 5 has a two-layer structure including the piezoelectric fiber assembly 3 on the inner side and the substrate 2 on the outer side. It is assumed that a portion (a non-piezoelectric portion) 51 of the sock 5 other than the heel is made of the same material as the substrate 2.

The piezoelectric fiber assembly 3 is fixed to the substrate 2 at opposed ends thereof in a front-rear direction, for example, by sewing. The piezoelectric fiber assembly 3 is joined to the substrate 2 so that the piezoelectric fiber assembly 3 is pre-stretched in the stretching direction E1 by a desired tension (e.g., 0.5 N or more) when the wearer wears the socks 5. The piezoelectric fiber assembly 3 that is pre-stretched by the desired tension generates an electric field in response to a minute movement of the wearer's heel. As a result, the sock 5 in which the piezoelectric fiber composite 1 has been applied to the heel portion 50 exhibits antibacterial properties upon application of a small amount of external energy.

The substrate 2 is preferably a sturdy cloth that is hard to stretch (deform). In this case, the presence of the substrate 2 in the heel portion 50 of the sock 5 can reduce damage caused, for example, by rubbing, as compared with a case where the heel portion 50 does not have the substrate 2.

As a result, in a case where the piezoelectric fiber composite 1 is applied to the heel portion 50 of the sock 5, the sock 5 exhibits antibacterial properties upon application of a small amount of external energy while reducing damage of the heel portion 50.

The material of the non-piezoelectric portion 51 may be different from that of the substrate 2. The non-piezoelectric portion 51 and the substrate 2 may also be integrally formed.

As described above, the piezoelectric fiber composite can be applied to various kinds of clothes, medical parts, electric products, and the like. For example, the piezoelectric fiber composite 1 can be applied to a wide variety of products such as socks, underwear, gauze, masks, sanitary goods (e.g., sanitary panties, disposable paper diapers, cloth diapers, and diaper covers), various filters (e.g., filters for water purifiers, air conditioners, and air purifiers), and seats (e.g., seats for cars, trains, and airplanes).

Modifications of the piezoelectric fiber composite 1 are listed below. Note that description of parts identical to those of the piezoelectric fiber composite 1 described above will be omitted.

Figure 9:
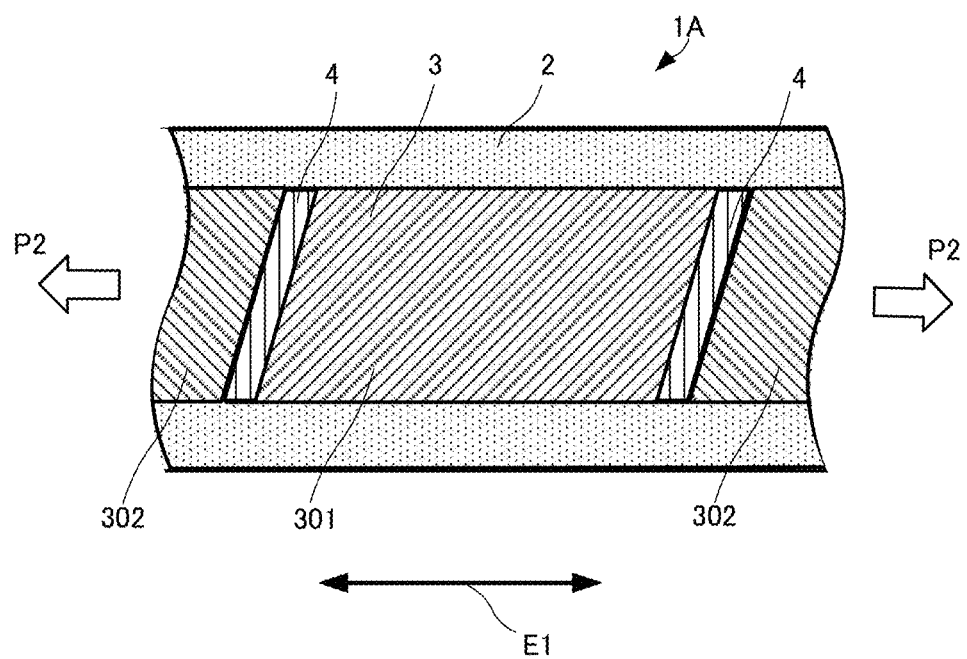
FIG. 9 is a configuration diagram illustrating an example of a piezoelectric fiber composite according to Modification 1.

FIG. 9 is a configuration diagram illustrating an example of a piezoelectric fiber composite 1A according to Modification 1. As illustrated in FIG. 9, the piezoelectric fiber composite 1A is different from the piezoelectric fiber composite 1 described above in that the piezoelectric fiber composite 1A has a stretching region 301 and a normal region 302. The stretching region 301 is, for example, a region that is pre-stretched by a desired load (for example, a tension P2 of 0.5 N) when a wearer wears (uses) the piezoelectric fiber composite 1A. The normal region 302 is a region other than the stretching region 301 and is a region that expands and contracts in response to movement of a wearer's body or in accordance with a shape of the body. Joint portions 4 join the piezoelectric fiber assembly 3 to the substrate 2 at opposed ends of the stretching region 301 in the stretching direction E1, for example, by stitching.

Figure 10:
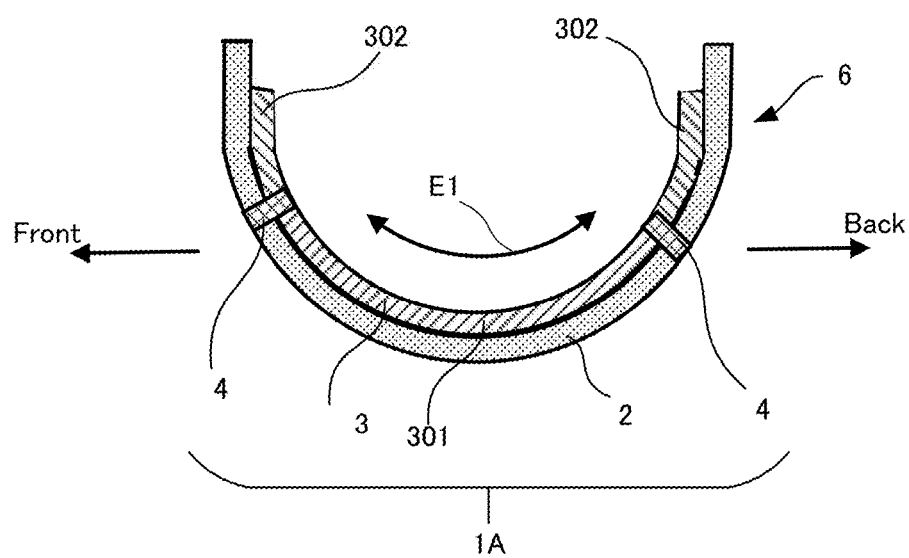
FIG. 10 is a schematic diagram illustrating a sanitary goods to which the piezoelectric fiber composite according to Modification 1 has been applied.

The following describes an example in which the piezoelectric fiber composite 1A is applied to sanitary panties (sanitary goods) 6. FIG. 10 is a schematic diagram illustrating the sanitary goods (sanitary panties) 6 to which the piezoelectric fiber composite 1A according to Modification 1 has been applied. As illustrated in FIG. 10, the piezoelectric fiber assembly 3 has the stretching region 301 and the normal region 302. The stretching region 301 is located in a lower portion of the sanitary panties 6. The joint portions 4 join the piezoelectric fiber assembly 3 to the substrate 2 at both ends of the stretching region 301 in the front-rear direction. That is, the stretching region 301 is being stretched in the front-rear direction between the two joint portions 4 that are arranged in the front-rear direction while a wearer wears the sanitary panties 6. The normal region 302 expands and contracts as appropriate, for example, in response to movement of the wearer.

In the piezoelectric fiber composite 1A according to Modification 1, the stretching region 301 is being stretched while the wearer wears the sanitary panties 6, and therefore an electric field is generated with a smaller amount of external energy than in the normal region 302. Thus, the piezoelectric fiber composite 1A according to Modification 1 exhibits antibacterial properties. That is, in the piezoelectric fiber composite 1A according to Modification 1, the normal region 302 exhibits antibacterial properties since the normal region 302 expands and contracts in response to movement of the wearer and thereby generates an electric field. Furthermore, the stretching region 301 exhibits antibacterial properties since the stretching region 301 expands and contracts upon application of a small amount of external energy that is unnoticeable to the wearer and thereby generates an electric field. As described above, the piezoelectric fiber composite 1A according to Modification 1 exhibits an antibacterial effect more effectively since the piezoelectric fiber assembly 3 has the stretching region 301 and the normal region 302.

Figure 11:
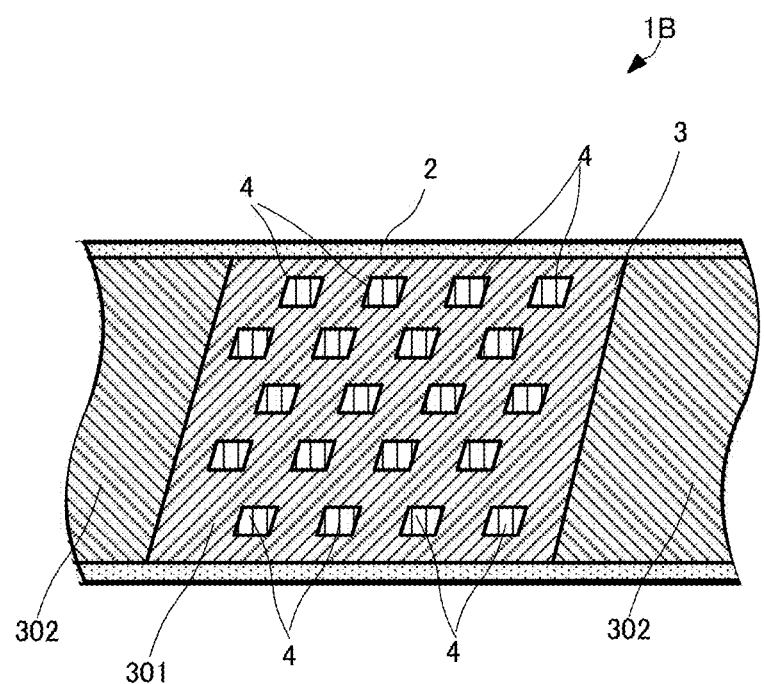
FIG. 11 is a configuration diagram illustrating an example of a piezoelectric fiber composite according to Modification 2.

FIG. 11 is a configuration diagram illustrating an example of a piezoelectric fiber composite 1B according to Modification 2. As illustrated in FIG. 11, the piezoelectric fiber composite 1B according to Modification 2 is different from the piezoelectric fiber composite 1 and the piezoelectric fiber composite 1A in that a plurality of joint portions 4 are arranged in a scattered manner in a plane direction in the stretching region 301. Since the plurality of joint portions 4 are arranged in a scattered manner, an electric field is generated upon application of a small amount of external energy and an antibacterial effect is exhibited without impairing the stretchability or flexibility of the piezoelectric fiber composite 1B. The plurality of joint portions 4 may be arranged on one or more straight lines. Further, the plurality of joint portions 4 may be arranged in a staggered manner (alternately).

Since the piezoelectric fiber composite 1B according to Modification 2 has the plurality of joint portions 4, small external energy is easily transmitted to piezoelectric fiber 31 and piezoelectric fiber 32. The piezoelectric fiber composite 1B according to Modification 2 has the plurality of joint portions 4 and exhibits antibacterial properties since the piezoelectric fiber assembly 3 stretched between the joint portions 4 expands and contracts upon application of a small amount of external energy.

Figure 12:
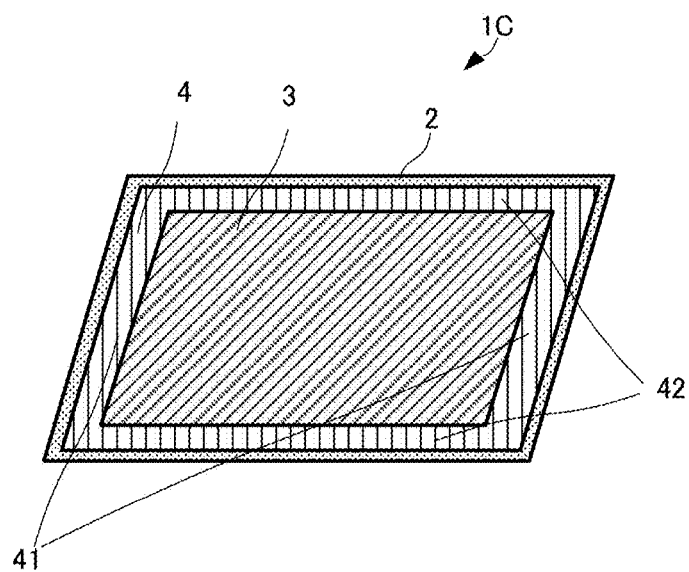
FIG. 12 is a configuration diagram illustrating an example of a piezoelectric fiber composite according to Modification 3.

FIG. 12 is a configuration diagram illustrating an example of a piezoelectric fiber composite 1C according to Modification 3. The piezoelectric fiber composite 1C according to Modification 3 is different from the piezoelectric fiber composite 1, the piezoelectric fiber composite 1A, and the piezoelectric fiber composite 1B in that a single joint portion 4 is arranged so as to surround the piezoelectric fiber assembly 3, as illustrated in FIG. 12. As shown in FIG. 12, single joint portion 4 includes two sets of portions 41 and 42 that face each other.

Since the two sets of portions 41 and 42 that face each other of the piezoelectric fiber composite 1C according to Modification 3 are joined to the substrate 2 so as to surround the piezoelectric fiber assembly 3, small external energy is easily transmitted to the piezoelectric fiber 31 and the piezoelectric fiber 32. In the piezoelectric fiber composite 1C according to Modification 3, a periphery of the piezoelectric fiber assembly 3 is fixed, and therefore the piezoelectric fiber assembly 3 exhibits antibacterial properties by expanding and contracting upon application of a small amount of external energy, for example, while being stretched between the set of portions 41 that face each other.

The piezoelectric fiber assembly 3 may be configured to include a thread other than an S thread that generates negative charges on the surface and a Z thread that generates positive charges on the surface. By adjusting used amounts of the Z thread and the S thread, it is possible to adjust, for example, a ratio of polarities of generated electrical charges depending on usage. Further, the piezoelectric fiber 31 may be configured to include a thread (e.g., a cotton thread) that does not generate electrical charges in addition to the Z thread and the S thread. Typically, a piezoelectric thread has a poorer feel than threads such as a cotton thread and therefore may irritate a wearer's skin. Partially using a thread (e.g., a cotton thread) that does not generate electrical charges in the piezoelectric fiber assembly 3 gives the piezoelectric fiber assembly 3 a better feel and mitigates skin irritation of the piezoelectric fiber composites 1, 1A, 1B, and 1C.

Furthermore, the piezoelectric fiber composites 1, 1A, 1B, and 1C may use the Z thread or the S thread alone. Even in a case where the Z thread or the S thread is used alone, the piezoelectric fiber composites 1, 1A, 1B, and 1C exhibit antibacterial properties.

Only a single joint portion 4 may be provided, as long as the joint portion 4 has portions that face each other. For example, the joint portion 4 may have a U-shape.

The piezoelectric fiber composites 1, 1A, 1B, and 1C can be used as a method for suppressing bacteria on body surfaces of animals other than humans. In a case where the piezoelectric fiber assemblies 3 are disposed on at least a part of animal's skin so as to face each other, the piezoelectric fiber composites 1, 1A, 1B, and 1C can suppress growth of bacteria on a body surface of the animal due to electrical charges generated upon application of external force to the piezoelectric fiber assemblies 3.

The filaments 300 can be produced, for example, by a method of extruding a piezoelectric polymer to form fibers, a method of melt-spinning a piezoelectric polymer to form fibers (for example, including a spinning/drawing method of separately performing a spinning step and a drawing step, a spin-draw method in which a spinning step and a drawing step are combined, a POY-DTY method capable of simultaneously performing a false twisting step, or an ultra-high-speed spinning method for achieving a higher speed), a method of turning a piezoelectric polymer into fibers by dry or wet spinning (for example, including a phase separation method or a dry wet spinning method of dissolving a polymer as a raw material in a solvent and extruding the polymer from a nozzle to form fibers, a gel spinning method of forming fibers uniformly from a gel containing a solvent, or a liquid crystal spinning method of forming fibers by using a liquid crystal solution or melt), or a method of turning a piezoelectric polymer into fibers by electrostatic spinning.

The joint portions 4 may join the piezoelectric fiber assembly 3 to the substrate 2 by using an adhesive or the like. The joint portions 4 may join the piezoelectric fiber assembly 3 to the substrate 2 by thermocompression bonding.

The piezoelectric fiber 31 or the piezoelectric fiber 32 is not limited to a knit using the filaments 300, and may be a woven fabric or a non-woven fabric using the filaments 300.

The piezoelectric fiber 31 or the piezoelectric fiber 32 may be a thread using PDLA. In a case where a thread using PDLA is used, positive and negative charges generated on the surfaces of the piezoelectric fiber 31 and the piezoelectric fiber 32 are different from electrical charges generated in a case where a thread using PLLA is used.

Finally, the description of the present embodiment should be considered as illustrative in all points and not restrictive. The scope of the present invention is indicated not by the above embodiment but by the claims. Further, the scope of the present invention is intended to include meanings equivalent to the claims and all modifications within the scope.

REFERENCE SIGNS LIST

1, 1A, 1B, 1C piezoelectric fiber composite
2 substrate
3 piezoelectric fiber assembly
4 joint portion
5 sock (piezoelectric clothing)
6 sanitary panties (sanitary goods)
30A, 30B axial direction
31, 32 piezoelectric fiber
41, 42 portion
50 heel portion
51 non-piezoelectric portion
300 filament
301 stretching region
302 normal region
900 uniaxial stretching direction
910A first diagonal line
910B second diagonal line
A1, A2 angle
E1 one direction (stretching direction)
P1, P2 tension (external energy)
S1 stress

The invention claimed is:

1. A piezoelectric fiber composite comprising:
a substrate having a first expansion and contraction rate;
a piezoelectric fiber assembly having piezoelectric fibers that generate electrical charges upon application of external energy, the piezoelectric fiber assembly having a second expansion and contraction rate different from the first expansion and contraction rate of the substrate; and
at least two separate joint portions that face each other across the piezoelectric fiber assembly and join the substrate and the piezoelectric fiber assembly such that the piezoelectric fiber assembly is stretchable between the at least two separate joint portions.

2. The piezoelectric fiber composite according to claim 1, wherein the first expansion and contraction rate of the substrate is lower than the second expansion and contraction rate of the piezoelectric fiber assembly.

3. The piezoelectric fiber composite according to claim 1, wherein the piezoelectric fiber assembly is joined to the substrate in a state of being stretched to a length longer than a natural length of the piezoelectric fiber assembly.

4. The piezoelectric fiber composite according claim 1, wherein
the substrate has a sheet shape; and
the piezoelectric fiber assembly is disposed on one surface of the substrate.

5. The piezoelectric fiber composite according to claim 1, wherein the piezoelectric fiber assembly is constructed such that the electrical charges generated upon the application of the external energy are sufficient to exhibit antibacterial properties.

6. The piezoelectric fiber composite according to claim 1, wherein the piezoelectric fibers comprise polylactic acid.

7. The piezoelectric fiber composite according to claim 1, wherein the piezoelectric fibers include a right-handed piezoelectric thread and a left-handed piezoelectric thread.

8. The piezoelectric fiber composite according to claim 7, wherein the right-handed piezoelectric thread and the left-handed piezoelectric thread are each multifilament threads.

9. A piezoelectric clothing comprising the piezoelectric fiber composite according to claim 1.

10. The piezoelectric clothing according to claim 9, wherein the piezoelectric fiber assembly is arranged on a body facing side of the piezoelectric clothing.

* * * * *